United States Patent
Shen et al.

(10) Patent No.: US 10,230,073 B2
(45) Date of Patent: Mar. 12, 2019

(54) ORGANIC LIGHT-EMITTING DISPLAY PANEL AND DISPLAY DEVICE

(71) Applicant: BOE TECHNOLOGY GROUP CO., LTD., Beijing (CN)

(72) Inventors: Wulin Shen, Beijing (CN); Jun Cheng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 104 days.

(21) Appl. No.: 15/321,154

(22) PCT Filed: Feb. 26, 2016

(86) PCT No.: PCT/CN2016/074642
§ 371 (c)(1),
(2) Date: Dec. 21, 2016

(87) PCT Pub. No.: WO2016/155437
PCT Pub. Date: Oct. 6, 2016

(65) Prior Publication Data
US 2017/0194596 A1    Jul. 6, 2017

(30) Foreign Application Priority Data

Mar. 27, 2015 (CN) .......................... 2015 1 0142685

(51) Int. Cl.
*H01L 51/52* (2006.01)
(52) U.S. Cl.
CPC ........ *H01L 51/529* (2013.01); *H01L 51/5237* (2013.01); *H01L 51/5246* (2013.01); *H01L 51/5259* (2013.01); *H01L 51/5253* (2013.01)
(58) Field of Classification Search
None
See application file for complete search history.

(56) References Cited

U.S. PATENT DOCUMENTS 6,204,600 B1 * 3/2001 Park ...................... H01J 29/467
    313/306
6,867,539 B1 * 3/2005 McCormick ........ H01L 51/5253
    257/40

(Continued)

FOREIGN PATENT DOCUMENTS

CN    1607866 A    4/2005
CN    101106156 A    1/2008

(Continued)

OTHER PUBLICATIONS

Office Action dated Mar. 3, 2017 issued in corresponding Chinese Application No. 201510142685.8.

(Continued)

*Primary Examiner* — Michael Lebentritt
(74) *Attorney, Agent, or Firm* — Nath, Goldberg & Meyer; Joshua B. Goldberg

(57) ABSTRACT

The present invention provides an organic light-emitting display panel, comprising: a substrate; a light-emitting unit provided on the substrate; and a package structure covering the light-emitting unit. The organic light-emitting display panel further comprises a thermally conductive structure, and the thermally conductive structure is at a side of the light-emitting unit far away from the substrate. Correspondingly, the present invention further provides a display device. The thermally conductive structure provided by the present invention can rapidly dissipate the heat generated by the light-emitting unit, so that the organic light-emitting display panel has an improved performance and the display device has an extended service life.

19 Claims, 2 Drawing Sheets

(56) References Cited

U.S. PATENT DOCUMENTS

| | | | |
|---|---|---|---|
| 7,230,594 B2 | 6/2007 | Miller et al. | |
| 8,033,706 B1* | 10/2011 | Kelly | G02B 6/0036 362/307 |
| 2003/0178221 A1* | 9/2003 | Chiu | H01B 1/22 174/117 F |
| 2004/0173900 A1* | 9/2004 | Chen | H01L 21/288 257/734 |
| 2005/0077601 A1* | 4/2005 | Yu | H01L 51/529 257/675 |
| 2005/0087769 A1* | 4/2005 | Yamazaki | H01L 27/1214 257/202 |
| 2005/0110396 A1* | 5/2005 | Cok | H01L 51/529 313/503 |
| 2005/0117293 A1 | 6/2005 | Yokoyama | |
| 2005/0184662 A1* | 8/2005 | Cok | H01L 51/5243 313/512 |
| 2005/0285520 A1* | 12/2005 | Cok | H01L 51/529 313/512 |
| 2007/0029642 A1* | 2/2007 | Inagawa | H01L 21/67109 257/625 |
| 2007/0160319 A1* | 7/2007 | Wang | H01L 27/14618 385/14 |
| 2008/0012477 A1 | 1/2008 | Koo et al. | |
| 2009/0115833 A1* | 5/2009 | Soulliaert | B41J 2/45 347/238 |
| 2010/0156763 A1 | 6/2010 | Lee et al. | |
| 2011/0096504 A1* | 4/2011 | Hild | H01L 51/529 361/704 |
| 2011/0141694 A1* | 6/2011 | Kamiguchi | H05K 7/20963 361/704 |
| 2012/0197179 A1* | 8/2012 | Khan | A61N 5/062 604/20 |
| 2013/0056783 A1* | 3/2013 | Aurongzeb | H01L 51/529 257/99 |
| 2013/0248143 A1* | 9/2013 | Zhang | F28F 3/02 165/47 |
| 2013/0278144 A1 | 10/2013 | Levermore et al. | |
| 2013/0341601 A1 | 12/2013 | Pyo et al. | |
| 2014/0077688 A1 | 3/2014 | Weaver et al. | |
| 2014/0342117 A1 | 11/2014 | Wang et al. | |
| 2014/0353848 A1* | 12/2014 | Park | H01L 23/36 257/783 |
| 2015/0137347 A1* | 5/2015 | Nakako | C09J 1/00 257/734 |
| 2016/0254485 A1 | 9/2016 | Song | |
| 2016/0325113 A1* | 11/2016 | Khan | A61N 5/062 |
| 2017/0110681 A1* | 4/2017 | Shen | H01L 51/529 |
| 2017/0137674 A1* | 5/2017 | Hwang | C09J 9/00 |
| 2017/0142861 A1* | 5/2017 | McLaughlin | H05K 7/2039 |
| 2017/0167710 A1* | 6/2017 | Wu | F21V 29/502 |
| 2017/0242290 A1* | 8/2017 | Jenkins | G02F 1/133385 |
| 2018/0037001 A1* | 2/2018 | Nagashima | B32B 9/04 |

FOREIGN PATENT DOCUMENTS

| | | |
|---|---|---|
| CN | 101552311 A | 10/2009 |
| CN | 101763777 A | 6/2010 |
| CN | 102220005 A | 10/2011 |
| CN | 102235643 A | 11/2011 |
| CN | 103331245 A | 10/2013 |
| CN | 103515542 A | 1/2014 |
| CN | 103843140 A | 6/2014 |
| CN | 104091890 A | 10/2014 |
| CN | 104183785 A | 12/2014 |
| CN | 203983342 U | 12/2014 |
| CN | 104701353 A | 6/2015 |
| CN | 205385043 U | 7/2016 |

OTHER PUBLICATIONS

International Search Report dated May 30, 2016 issued in corresponding International Application No. PCT/CN2016/074642 along with an English translation of the Written Opinion of the International Search Authority.

* cited by examiner

ORGANIC LIGHT-EMITTING DISPLAY PANEL AND DISPLAY DEVICE

This is a National Phase Application filed under 35 U.S.C. 371 as a national stage of PCT/CN2016/074642, filed Feb. 26, 2016, an application claiming the benefit of Chinese Application No. 201510142685.8, filed Mar. 27, 2015, the content of each of which is hereby incorporated by reference in its entirety.

FIELD OF THE INVENTION

The present invention relates to the field of display technology, and in particular, relates to an organic light-emitting display panel and a display device including the organic light-emitting display panel.

BACKGROUND OF THE INVENTION

An organic light-emitting diode (OLED) has been widely adopted in the field of display due to its characteristics of self-luminescence, high contrast, low power consumption, and the like.

The principle of light emitting of the OLED is as follows. Electric current is applied to an organic light-emitting layer to cause electric energy to be converted into light energy, so that the organic light-emitting layer is excited to emit light. In such a light-emitting manner, the OLED will generate a great amount of heat while emitting light, causing a display panel including the OLED to have an increased temperature. Thus, the performance and the service life of each of the display panel and the organic light-emitting layer are degraded.

SUMMARY OF THE INVENTION

An object of the present invention is to provide an organic light-emitting display panel and a display device including the organic light-emitting display panel, wherein the organic light-emitting display panel can dissipate heat rapidly, so that the display device has an improved performance.

To achieve the above object, the present invention provides an organic light-emitting display panel, which includes a substrate; a light-emitting unit provided on the substrate; and a package structure covering the light-emitting unit; wherein, the organic light-emitting display panel further includes a thermally conductive structure, and the thermally conductive structure is at a side of the light-emitting unit far away from the substrate.

Optionally, the package structure includes a package adhesive layer, and the thermally conductive structure includes a thermally conductive particle provided in the package adhesive layer.

Optionally, the thermally conductive particle has a diameter ranging from 1 μm to 3 μm.

Optionally, the thermally conductive particle has a thermal conductivity ranging from 100 W/mK to 8,000 W/mK.

Optionally, a material of the thermally conductive particle includes any one or more of silver, copper, gold, aluminum, diamond, graphite, graphene, and carbon nanotube.

Optionally, the thermally conductive structure includes a thermally conductive layer provided between the light-emitting unit and the package structure.

Optionally, the thermally conductive layer has a thickness ranging from 1 μm to 100 μm.

Optionally, the thermally conductive layer has a thermal conductivity ranging from 100 W/mK to 8,000 W/mK.

Optionally, a material of the thermally conductive layer includes any one or more of silver, copper, gold, aluminum, diamond, graphite, graphene, and carbon nanotube.

Optionally, the package structure further includes a cover plate provided at a side of the package adhesive layer far away from the substrate, the organic light-emitting display panel further includes a heat dissipation structure provided at a side of the cover plate far away from the substrate, and an outer surface of the heat dissipation structure has a larger area than that of a surface of the cover plate on which the heat dissipation structure is provided.

Optionally, the organic light-emitting display panel further includes a heat dissipation structure provided at a side of the package structure far away from the substrate, wherein an outer surface of the heat dissipation structure has a larger area than that of a surface of the package structure on which the heat dissipation structure is provided.

Optionally, the heat dissipation structure includes a heat sink and a plurality of fins which are provided on the heat sink and have an interval therebetween, and the heat sink is provided on the package structure.

Optionally, each of the plurality of fins has a diameter ranging from 1 mm to 5 mm and a height ranging from 1 mm to 15 mm, and two adjacent ones of the plurality of fins have an interval ranging from 2 mm to 5 mm therebetween.

Optionally, the plurality of fins and the heat sink are integrally formed.

Optionally, a water absorption particle is provided in the package adhesive layer.

Optionally, a material of the water absorption particle includes calcium oxide.

Optionally, the package adhesive layer includes an inorganic film and an organic film which are provided sequentially on the light-emitting unit, a material of the inorganic film includes any one or more of silicon nitride, silicon oxide, and silicon oxynitride, a material of the organic film includes resin, and the thermally conductive particle and the water absorption particle are provided in the organic film.

Correspondingly, the present invention further provides a display device, which includes the above organic light-emitting display panel provided by the present invention.

The thermally conductive structure provided by the present invention can rapidly dissipate the heat generated by the light-emitting unit so as to prevent a temperature of the organic light-emitting display panel from increasing, thereby improving the performance of the organic light-emitting display panel. Herein, the thermally conductive structure may include the thermally conductive particles provided in the package adhesive layer, such that the overall thermal conductivity of the package adhesive layer is increased and the uniformity of heat distribution of the organic light-emitting display panel is increased. Further, the thermally conductive structure provided by the present invention causes the organic light-emitting display panel to have a larger contact area with the outside, such that heat is dissipated more rapidly, thus the organic light-emitting display panel has improved stability and more uniform brightness.

BRIEF DESCRIPTION OF THE DRAWINGS

The accompanying drawings are provided for further understanding of the present invention and constitute a part of the description. The accompanying drawings, together with the following embodiments, are provided for explaining the present invention rather than limiting the present invention. In the drawings.

DESCRIPTION OF REFERENCE NUMERALS

10—substrate, 20—package structure, 21—package adhesive layer, 22—cover plate, 30—light-emitting unit, 31—cathode layer, 32—electroluminescent layer, 33—anode layer, 40—thermally conductive structure, 41—thermally conductive particle, 42—thermally conductive layer, 50—heat dissipation structure, 51—heat sink, 52—fin, 60—thin film transistor, 61—gate, 62—gate insulation layer, 63—active layer, 64 first electrode of the thin film transistor, 65—second electrode of the thin film transistor, 70—passivation layer, 80—planarization layer, 90—pixel definition layer.

DETAILED DESCRIPTION OF THE EMBODIMENTS

Embodiments of the present invention will be described in detail below with reference to the accompanying drawings. It should be noted that, the embodiments described herein are for the purpose of describing and explaining the present invention, rather than limiting the scope of the present invention.

Figure 1:
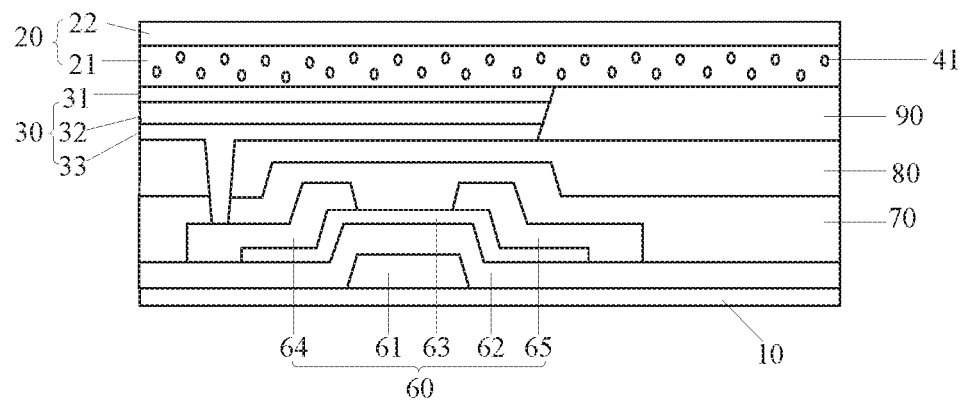
FIG. 1 is a schematic diagram showing a structure of an organic light-emitting display panel according to a first embodiment of the present invention.

As one aspect of the present invention, an organic light-emitting display panel is provided. As shown in FIG. 1, the organic light-emitting display panel includes a substrate 10, a light-emitting unit 30 provided on the substrate 10, and a package structure 20 covering the light-emitting unit 30. The organic light-emitting display panel further includes a thermally conductive structure 40 (in the example shown in FIG. 1, the thermally conductive structure 40 only includes thermally conductive particles 41), and the thermally conductive structure 40 is at a side of the light-emitting unit 30 far away from the substrate 10.

Generally, the package structure 20, which covers the light-emitting unit 30, may include an organic film. Since the organic film has a low thermal conductivity, the heat generated by the light-emitting unit is dissipated slowly. However, the thermally conductive structure 40 provided by the present invention can rapidly dissipate the heat generated by the light-emitting unit 30 so as to prevent a temperature of the organic light-emitting display panel from increasing, thereby improving the overall performance of the organic light-emitting display panel.

It should be noted that, a function of the thermally conductive structure 40 is to rapidly dissipate the heat generated by the light-emitting unit, thus the thermally conductive structure 40 should have a thermal conductivity larger than that of the organic film of the package structure 20.

The organic light-emitting display panel provided by the present invention is particularly suitable for a bottom-emission type display panel. The light-emitting unit 30 includes a cathode layer 31, an electroluminescent layer 32 and an anode layer 33 which are arranged sequentially. Herein, the cathode layer 31 may be made of a metal such as aluminum, and the anode layer 33 may be made of a transparent material such as indium tin oxide (ITO), such that light emitted from the electroluminescent layer 32 can pass through the anode layer 33 and emit from the substrate 10 outwards. The thermally conductive structure 40 may be provided above the light-emitting unit 30, i.e., at a side of the light-emitting unit 30 far away from the substrate 10, so as not to block the light emitted from the light-emitting unit 30.

As a first embodiment of the present invention, as shown in FIG. 1, the organic light-emitting display panel includes the substrate 10, the light-emitting unit 30 provided on the substrate 10, and the package structure 20 covering the light-emitting unit 30. The organic light-emitting display panel further includes the thermally conductive structure 40 (in the example shown in FIG. 1, the thermally conductive structure 40 only includes thermally conductive particles 41), and the thermally conductive structure 40 is at a side of the light-emitting unit 30 far away from the substrate 10.

Herein, the package structure 20 includes a package adhesive layer 21 and a cover plate 22, and the package adhesive layer 21 is provided between the cover plate 22 and the light-emitting unit 30. Although in the example shown in FIG. 1 the package structure 20 includes the package adhesive layer 21 and the cover plate 22, in a practical application the package structure 20 may include the package adhesive layer 21 only. The thermally conductive structure 40 includes the thermally conductive particles 41 provided in the package adhesive layer 21. By doping the thermally conductive particles 41 into the package adhesive layer 21, the package adhesive layer 21 doped with the thermally conductive particles 41 may have an increased overall thermal conductivity, facilitating rapid dissipation of heat. Thus, the organic light-emitting display panel can have a more uniform temperature and improved stability.

Optionally, the thermally conductive particles 41 each have a diameter ranging from 1 μm to 3 μm, such that the thermally conductive particles can be distributed in the package adhesive layer 21 uniformly, and the package adhesive layer 21 doped with the thermally conductive particles 41 has an increased overall thermal conductivity and an undegraded packaging effect.

To improve the thermally conductive efficiency of the thermally conductive particles 41, optionally, the thermally conductive particles 41 each have a thermal conductivity ranging from 100 W/mK to 8,000 W/mK, such that the dissipation rate of heat is increased. Thus, the organic light-emitting display panel can have a more uniform distribution of heat and an improved performance.

Specifically, a material of the thermally conductive particles 41 may include any one or more of silver, copper, gold, aluminum, diamond, graphite, graphene, and carbon nanotube.

Figure 2:
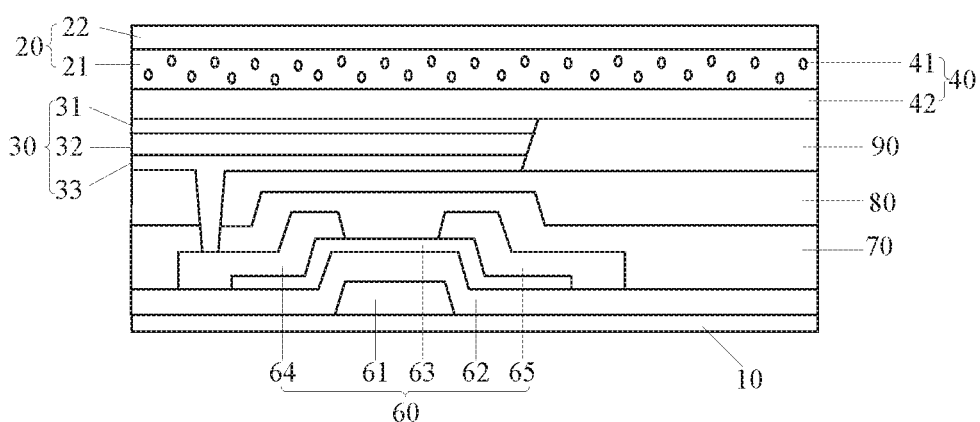
FIG. 2 is a schematic diagram showing a structure of an organic light-emitting display panel according to a second embodiment of the present invention.

As a second embodiment of the present invention, as shown in FIG. 2, the organic light-emitting display panel includes the substrate 10, the light-emitting unit 30 provided on the substrate 10, and the package structure 20 covering the light-emitting unit 30. The organic light-emitting display panel further includes the thermally conductive structure 40, and the thermally conductive structure 40 is at a side of the light-emitting unit 30 far away from the substrate 10.

Herein, the package structure 20 includes the package adhesive layer 21 and the cover plate 22, and the package adhesive layer 21 is provided between the cover plate 22 and the light-emitting unit 30. Although in the example shown in FIG. 2 the package structure 20 includes the package adhesive layer 21 and the cover plate 22, in a practical application the package structure 20 may include the package adhesive layer 21 only. The thermally conductive structure 40 includes the thermally conductive particles 41 provided in the package adhesive layer 21 and a thermally conductive layer 42 provided between the light-emitting unit 30 and the package adhesive layer 21. Once the light-emitting unit 30 generates heat, the thermally conductive layer 42 can uniformly dissipate the heat generated by the light-emitting unit 30. Thus, the organic light-emitting display panel can have improved stability and more uniform brightness. By providing both the thermally conductive layer 42 and the thermally conductive particles 41, the heat can be dissipated more rapidly, and thus the organic light-emitting display panel can have a more uniform heat distribution. Although in the example shown in FIG. 2 the thermally conductive structure 40 includes the thermally conductive particles 41 and the thermally conductive layer 42, in a practical application the thermally conductive structure 40 may include the thermally conductive particles 41 only (as the configuration shown in FIG. 1) or the thermally conductive layer 42 only.

The thermally conductive layer 42 may be formed in various ways. For example, the thermally conductive layer 42 may be formed by depositing a material of the thermally conductive layer 42 on the substrate on which the light-emitting unit 30 is formed by sputtering, vapor deposition, coating, or the like.

Specifically, a material of each of the thermally conductive particle 41 and the thermally conductive layer 42 may include any one or more of silver, copper, gold, aluminum, diamond, graphite, graphene, and carbon nanotube. For example, the thermally conductive particles 41 each are made of copper, and the thermally conductive layer 42 is made of aluminum.

Optionally, the thermally conductive layer 42 has a thickness ranging from 1 μm to 100 μm, such that the thickness of the organic light-emitting display panel is prevented from increasing significantly while the dissipation rate of heat and the uniformity of heat distribution are increased. However, the thickness of the thermally conductive layer 42 is not limited thereto.

In the second embodiment, both the thermally conductive particles 41 and the thermally conductive layer 42 may have a thermal conductivity ranging from 100 W/mK to 8,000 W/mK, such that the thermally conductive effects of the thermally conductive layer 42 and the package adhesive layer 21 doped with the thermally conductive particles 41 are improved, and the dissipation rate of heat is increased. Thus, the organic light-emitting display panel can have more uniform distribution of heat, which facilitates dissipating heat outwards. As a result, the overall performance of the organic light-emitting display panel is improved.

Figure 3:
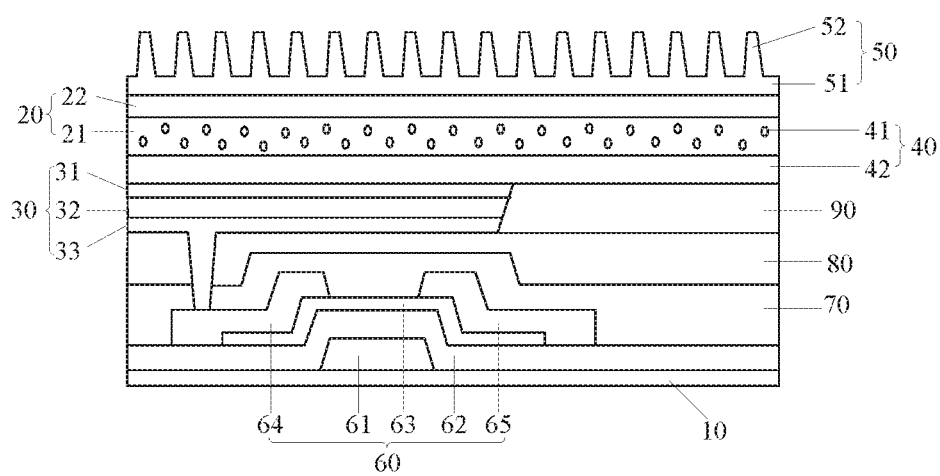
FIG. 3 is a schematic diagram showing a structure of an organic light-emitting display panel according to a third embodiment of the present invention.

As a third embodiment of the present invention, as shown in FIG. 3, the organic light-emitting display panel includes the substrate 10, the light-emitting unit 30 provided on the substrate 10, and the package structure 20 covering the light-emitting unit 30. The organic light-emitting display panel further includes the thermally conductive structure 40, and the thermally conductive structure 40 is at a side of the light-emitting unit 30 far away from the substrate 10.

Herein, the package structure 20 includes the package adhesive layer 21 and the cover plate 22, and the package adhesive layer 21 is provided between the cover plate 22 and the light-emitting unit 30. Although in the example shown in FIG. 3 the package structure 20 includes the package adhesive layer 21 and the cover plate 22, in a practical application the package structure 20 may include the package adhesive layer 21 only. The thermally conductive structure 40 includes the thermally conductive particles 41 provided in the package adhesive layer 21 and the thermally conductive layer 42 provided between the light-emitting unit 30 and the package adhesive layer 21. Although in the example shown in FIG. 3 the thermally conductive structure 40 includes the thermally conductive particles 41 and the thermally conductive layer 42, in a practical application the thermally conductive structure 40 may include the thermally conductive particles 41 only or the thermally conductive layer 42 only.

The organic light-emitting display panel may further include a heat dissipation structure 50 provided on the cover plate 22 of the package structure 20. That is, the dissipation structure 50 is provided at a side of the cover plate 22 far away from the substrate 10. An outer surface of the heat dissipation structure 50 has a larger area than that of a surface of the cover plate 22 on which the heat dissipation structure 50 is provided.

In the third embodiment, by providing both the thermally conductive particles 41 and the thermally conductive layer 42, the heat generated by the light-emitting unit 30 can be outwards dissipated rapidly, and the heat can be distributed more uniformly in the organic light-emitting display panel, thereby improving the stability of the organic light-emitting display panel. Further, since the heat dissipation structure 50 is provided on the cover plate 22 and the outer surface of the heat dissipation structure 50 has a larger area than that of a surface of the cover plate 22 on which the heat dissipation structure 50 is provided, a contact area of the organic light-emitting display panel with the outside air is increased. As a result, heat dissipation efficiency is further increased.

Specifically, to make the heat dissipation structure 50 have a larger heat dissipation area (i.e., a larger surface area), as shown in FIG. 3, the heat dissipation structure 50 includes a heat sink 51 and a plurality of fins 52 which are provided on the heat sink 51 and have an interval therebetween, and the heat sink 51 is provided on the cover plate 22. In other words, the plurality of fins 52 are provided at a side of the heat sink 51 far away from the substrate 10.

Specifically, each of the plurality of fins 52 has a diameter ranging from 1 mm to 5 mm and a height ranging from 1 mm to 15 mm, and two adjacent ones of the plurality of fins 52 have an interval ranging from 2 mm to 5 mm therebetween. Thus, the heat dissipation area of the heat dissipation structure 50 is increased significantly. As a result, the dissipation rate of heat is increased while the thickness of the organic light-emitting display panel is prevented from increasing significantly.

The heat sink 51 and the fins 52 may be made of different materials or a same material, and may be formed into separate structures or a one-piece structure. For ease of manufacturing, the fins 52 and the heat sink 51 are formed into a one-piece structure. The heat dissipation structure 50 may be formed by a patterning process. Specifically, a heat dissipation material layer and a photoresist layer may be formed sequentially on the cover plate 22 firstly, and then exposure and development are performed on the photoresist layer. Herein, during the exposure of the photoresist layer, a light non-transmissive region of a mask corresponds to a region of the heat dissipation material layer to be formed into the fin 52, and a semi-transparent region of the mask corresponds to a region of the heat dissipation material layer to be formed into an interval between two adjacent fins, so that after the development of the photoresist layer, the region of the heat dissipation material layer to be formed into the fin 52 is remained, and the region of the heat dissipation material layer to be formed into an interval between two adjacent fins is removed. Thereafter, the heat dissipation material layer is etched to form the heat dissipation structure 50. During the etching, a height of each fin 52 may be controlled by adjusting an etching time.

Specifically, the thermally conductive particle 41, the thermally conductive layer 42, the heat sink 51 and the fin 52 each may have a thermal conductivity ranging from 100 W/mK to 8,000 W/mK, such that the thermally conductive effects of the thermally conductive layer 42 and the package adhesive layer 21 doped with the thermally conductive particles 41 are improved, and the heat dissipation efficiency of the heat dissipation structure 50 is increased. Thus, the organic light-emitting display panel can have more uniform distribution of heat, which facilitates dissipating heat outwards. As a result, the overall performance of the organic light-emitting display panel is improved.

A material of each of the thermally conductive particle 41, the thermally conductive layer 42, the heat sink 51 and the fin 52 may be any one or more of silver, copper, gold, aluminum, diamond, graphite, graphene, and carbon nanotube.

In the above embodiments of the present invention, water absorption particles may be further provided in the package adhesive layer 21 so as to prevent outside moisture from entering the interior of the organic light-emitting display panel, thereby improving the stability of the organic light-emitting display panel.

Specifically, a material of the water absorption particles may include calcium oxide. Each of the water absorption particles has a diameter ranging from 1 μm to 2 μm, such that good water absorption effect is achieved while the packaging effect of the package adhesive layer 21 will not be degraded.

The package adhesive layer 21 may include an inorganic film and an organic film which are provided sequentially on the light-emitting unit 30. A material of the inorganic film may include any one or more of silicon nitride, silicon oxide, and silicon oxynitride, and a material of the organic film may include resin or the like. The thermally conductive particles 41 and the water absorption particles may be provided in the organic film.

It should be noted that, the organic light-emitting display panel may further include a thin film transistor 60 provided between the substrate 10 and the light-emitting unit 30. As shown in FIGS. 1 to 3, the thin film transistor 60 includes a gate 61, a gate insulation layer 62, an active layer 63, and a first electrode 64 and a second electrode 65 of the thin film transistor which are provided sequentially on the substrate 10. A passivation layer 70 and a planarization layer 80 may be further sequentially provided between the thin film transistor 60 and the light-emitting unit 30. That is, the passivation layer 70 is provided between the planarization layer 80 and the thin film transistor 60. The anode layer 33 of the light-emitting unit is connected to the first electrode 64 of the thin film transistor through a via penetrating through the planarization layer 80 and the passivation layer 70. A pixel definition layer 90 may be further provided around each light-emitting unit 30 to separate two adjacent light-emitting units apart from each other.

It is apparent that, the thermally conductive structure provided by the present invention can rapidly dissipate the heat generated by the light-emitting unit so as to prevent a temperature of the organic light-emitting display panel from increasing. Herein, the thermally conductive structure may include the thermally conductive particles provided in the package adhesive layer, such that the overall thermal conductivity of the package adhesive layer is increased and the uniformity of heat distribution of the organic light-emitting display panel is increased. Further, the thermally conductive structure provided by the present invention causes the organic light-emitting display panel to have a larger contact area with the outside, such that heat is dissipated more rapidly, thus the organic light-emitting display panel has improved stability and more uniform brightness.

As another aspect of the present invention, a display device is provided. The display device includes the above organic light-emitting display panel provided by the present invention. Since the thermally conductive structure of the organic light-emitting display panel can rapidly dissipate the heat generated by the light-emitting unit, degradation of performance of the organic light-emitting display panel caused by the heat generated by the light-emitting unit can be reduced. As a result, the display device has an improved overall performance and an extended service life.

It should be understood that, the above embodiments are only exemplary embodiments for the purpose of explaining the principle of the present invention, but the present invention is not limited thereto. For a person having ordinary skill in the art, various improvements and modifications may be made without departing from the spirit and essence of the present invention. These improvements and modifications also fall within the protection scope of the present invention.

What is claimed is:

1. An organic light-emitting display panel, comprising:
   a substrate;
   a light-emitting unit provided on the substrate; and
   a package structure covering the light-emitting unit;
   wherein the organic light-emitting display panel further comprises a thermally conductive structure, and the thermally conductive structure is at a side of the light-emitting unit distal to the substrate; and
   wherein the package structure comprises a package adhesive layer, and the thermally conductive structure comprises a thermally conductive particle provided in the package adhesive layer.

2. The organic light-emitting display panel according to claim 1, wherein the thermally conductive particle has a diameter ranging from 1 μm to 3 μm.

3. The organic light-emitting display panel according to claim 1, wherein the thermally conductive particle has a thermal conductivity ranging from 100 W/mK to 8,000 W/mK.

4. The organic light-emitting display panel according to claim 1, wherein a material of the thermally conductive particle comprises any one or more of silver, copper, gold, aluminum, diamond, graphite, graphene, and carbon nanotube.

5. The organic light-emitting display panel according to claim 1, wherein the thermally conductive structure comprises a thermally conductive layer provided between the light-emitting unit and the package structure.

6. The organic light-emitting display panel according to claim 5, wherein the thermally conductive layer has a thickness ranging from 1 μm to 100 μm.

7. The organic light-emitting display panel according to claim 5, wherein the thermally conductive layer has a thermal conductivity ranging from 100 W/mK to 8,000 W/mK.

8. The organic light-emitting display panel according to claim 5, wherein a material of the thermally conductive layer comprises any one or more of silver, copper, gold, aluminum, diamond, graphite, graphene, and carbon nanotube.

9. The organic light-emitting display panel according to claim 1, wherein the package structure further comprises a cover plate provided at a side of the package adhesive layer distal to the substrate, the organic light-emitting display panel further comprises a heat dissipation structure provided at a side of the cover plate distal to the substrate, and an outer surface of the heat dissipation structure has a larger area than that of a surface of the cover plate on which the heat dissipation structure is provided.

10. The organic light-emitting display panel according to claim 5, further comprising a heat dissipation structure provided at a side of the package structure distal to the substrate, wherein an outer surface of the heat dissipation structure has a larger area than that of a surface of the package structure on which the heat dissipation structure is provided.

11. The organic light-emitting display panel according to claim 9, wherein the heat dissipation structure comprises a heat sink and a plurality of fins which are provided on the heat sink and have an interval therebetween, and the heat sink is provided on the package structure.

12. The organic light-emitting display panel according to claim 11, wherein each of the plurality of fins has a diameter ranging from 1 mm to 5 mm and a height ranging from 1 mm to 15 mm, and two adjacent ones of the plurality of fins have an interval ranging from 2 mm to 5 mm therebetween.

13. The organic light-emitting display panel according to claim 11, wherein the plurality of fins and the heat sink are integrally formed.

14. The organic light-emitting display panel according to claim 1, wherein a water absorption particle is provided in the package adhesive layer.

15. The organic light-emitting display panel according to claim 14, wherein a material of the water absorption particle comprises calcium oxide.

16. The organic light-emitting display panel according to claim 14, wherein the package adhesive layer comprises an inorganic film and an organic film which are provided sequentially on the light-emitting unit, a material of the inorganic film comprises any one or more of silicon nitride, silicon oxide, and silicon oxynitride, a material of the organic film comprises resin, and the thermally conductive particle and the water absorption particle are provided in the organic film.

17. A display device, comprising the organic light-emitting display panel according to claim 1.

18. The organic light-emitting display panel according to claim 1, wherein the thermally conductive structure comprises a thermally conductive layer provided between the light-emitting unit and the package structure.

19. The organic light-emitting display panel according to claim 10, wherein the heat dissipation structure comprises a heat sink and a plurality of fins which are provided on the heat sink and have an interval therebetween, and the heat sink is provided on the package structure.

* * * * *